United States Patent
Kim (10) Patent No.: US 6,423,608 B1
(45) Date of Patent: Jul. 23, 2002

(54) METHOD OF MANUFACTURING A CAPACITOR IN A SEMICONDUCTOR INTEGRATED CIRCUIT AND A CAPACITOR FABRICATED THEREBY

(75) Inventor: Yun-Ki Kim, Kyunggi-do (KR)

(73) Assignee: Samsung Electronics Co. Ltd., Kyungki-do (KR)

(*) Notice: Subject to any disclaimer, the term of this patent is extended or adjusted under 35 U.S.C. 154(b) by 0 days.

(21) Appl. No.: 09/704,764

(22) Filed: Nov. 3, 2000

(30) Foreign Application Priority Data

Nov. 5, 1999 (KR) .............................. 99-48927

(51) Int. Cl.⁷ .................. H01L 21/20; H01L 21/8242
(52) U.S. Cl. ........................ 438/396; 438/253
(58) Field of Search ................... 438/243, 392, 438/396, 253

(56) References Cited

U.S. PATENT DOCUMENTS

| | | | |
|---|---|---|---|
| 5,185,282 A | 2/1993 | Lee et al. ............... | 437/47 |
| 6,074,908 A * | 6/2000 | Huang ................. | 438/241 |
| 6,077,742 A * | 6/2000 | Chen et al. ............ | 438/255 |
| 6,136,643 A * | 10/2000 | Jenf et al. ............. | 438/253 |
| 6,137,179 A * | 10/2000 | Huang ................. | 257/763 |
| 6,251,741 B1 * | 6/2001 | Kinugasa et al. ....... | 438/396 |
| 6,337,267 B1 * | 1/2002 | Yang .................. | 438/618 |

FOREIGN PATENT DOCUMENTS

EP 0713249 5/1996

OTHER PUBLICATIONS

C.Y.Wong, et al., Sidewall Oxidation of PolycrystallineSilicon Gate, Sep. 1989, IEEE Electron Device Letters, vol. 10, No. 9, pp. 420–422.

* cited by examiner

Primary Examiner—Olik Chaudhuri
Assistant Examiner—William Vesperman
(74) Attorney, Agent, or Firm—Lee & Sterba, P.C.

(57) ABSTRACT

A capacitor in a semiconductor integrated circuit, and a method for fabricating the capacitor is disclosed. A method of an embodiment of the invention includes first providing a semiconductor substrate having disposed thereon an interlayer insulating layer. A lower sacrificial insulating layer and an upper etching stopper layer then are sequentially formed on the interlayer insulating layer on the semiconductor substrate. The upper etching stopper layer and the lower sacrificial insulating layer then are sequentially patterned to form a storage electrode hole, and to expose a predetermined portion of the interlayer insulating layer. The method then includes forming an outer cylindrical storage electrode in the storage electrode hole, a conductive liner surrounded by the outer cylindrical storage electrode, and an inner storage electrode surrounded by the conductive liner. Finally, the method of an embodiment of the invention includes selectively etching the conductive liner to expose an inner sidewall of the outer cylindrical storage electrode and an outer sidewall of the inner storage electrode. Depending on the storage electrode dimension, the inner storage electrode can exhibit a circular columnar configuration or a cylindrical configuration.

11 Claims, 10 Drawing Sheets

METHOD OF MANUFACTURING A CAPACITOR IN A SEMICONDUCTOR INTEGRATED CIRCUIT AND A CAPACITOR FABRICATED THEREBY

BACKGROUND OF THE INVENTION

1. Field of the Invention

The present invention relates to a capacitor in a semiconductor integrated circuit, and to a method of manufacturing the capacitor.

2. Description of the Related Art

Semiconductor memory devices are considered one of the crucial microelectronics components for mainframe computers, PCs, telecommunications, automotive and consumer electronics, and commercial and military avionics systems. Semiconductor memory devices can be characterized into either volatile random access memory devices (RAMs) or non-volatile memory devices (NVMs). RAMs can be divided into dynamic RAMs (DRMAs) and static RAMs (SRAMs). As is well known, the integration density of DRAMs is about four times as high as the integration density of SRAMs. As a consequence, DRAMs have been widely used in the memory devices of computer mainframe's memory.

Like in other memory devices, DRAMs include a cell array region having a plurality of memory cell arrays, and a peripheral circuit region controlling and driving the memory cell arrays. Each memory cell typically consists of a cell storage capacitor and an access transistor. The cell storage capacitor directly affects DRAM characteristics such as data retention, soft error rate, low voltage performance, and the like. Namely, higher capacitance of the cell capacitor improves the data retention characteristics and the low voltage characteristics, and it reduces the soft error rate. Accordingly, in order to realize high density DRAM devices, it usually is necessary to form a high performance cell capacitor with an acceptable level of capacitance in a given cell.

U.S. Pat. No. 5,185,282 by Lee et al., entitled "METHOD OF MANUFACTURING DRAM CELL HAVING A CUP SHAPED POLYSILICON STORAGE ELECTRODE," the disclosure of which is incorporated herein by reference, discloses a double cylindrical capacitor storage electrode. According to Lee et al., a first polysilicon layer, useful as an outer cylindrical storage electrode, is formed in a storage electrode hole. An oxide layer is formed on the first polysilicon layer. Then, the respective layers are anisotropically etched to form an oxide sidewall spacer on the first polysilicon layer. A second polysilicon layer, useful as an inner cylindrical storage electrode, then is formed on the bottom of the first cylindrical polysilicon layer and on the oxide sidewall spacer. Then, the oxide sidewall spacer is selectively removed to form a double cylindrical capacitor storage electrode. The bottom of the outer cylindrical storage electrode is directly in contact with the inner cylindrical storage electrode.

There can be some problems, however, with the method disclosed in Lee, et al. For example, since an anisotropic etching process forms the oxide spacer, there may be some etching damage on the bottom of the outer cylindrical storage electrode. This is because the anisotropic etching process typically is performed by a RIE (reactive ion etching) technique. Accordingly, etching by-products and the like may remain on the bottom of the outer cylindrical storage electrode during anisotropic etching, thereby causing contact failure between the outer cylindrical storage electrode and the inner cylindrical storage electrode. By-products can be removed by using a cleaning solution suitable for an oxide. However, over-cleaning is required to ensure complete removal of the by-products, thereby varying the thickness of the oxide spacer. Indeed, the oxide spacer can be completely removed in severe cases. As a result, it becomes very difficult to control the width of the spacer between the outer cylindrical storage electrode and the inner cylindrical storage electrode.

SUMMARY OF THE INVENTION

The present invention was made in view of the above-mentioned problems and it is a feature of an embodiment of the present invention to provide a method of manufacturing a capacitor that can improve contact resistance characteristics between an outer storage electrode and an inner storage electrode. It is another feature of an embodiment of the present invention to provide a method of manufacturing a capacitor that can ensure uniform inter-wall space between an outer storage electrode and an inner storage electrode. It is yet another feature of an embodiment of the present invention to provide a capacitor having a stable storage electrode.

In accordance with these and other features of the present invention, there is provided a method of manufacturing a capacitor in a semiconductor integrated circuit. A method of an embodiment of the invention includes first providing a semiconductor substrate having disposed thereon an interlayer insulating layer an upper etching stopper layer and a lower sacrificial insulating layer then are sequentially formed on the interlayer insulating layer on the semiconductor substrate the lower sacrificial insulating layer and the upper etching stopper layer then are sequentially patterned to form a storage electrode hole, and to expose a predetermined portion of the interlayer insulating layer. The method then includes forming an outer cylindrical storage electrode in the storage electrode hole, a conductive liner surrounded by the outer cylindrical storage electrode, and an inner storage electrode surrounded by the conductive liner. Finally, the method of an embodiment of the invention includes selectively etching the conductive liner to expose an inner sidewall of the outer cylindrical storage electrode and an outer sidewall of the inner storage electrode.

In accordance with an additional feature of an embodiment of the invention, there is provided a capacitor of a semiconductor integrated circuit that includes a semiconductor substrate, and an outer cylindrical storage electrode formed on the semiconductor substrate. In the capacitor of the invention, an inner storage electrode is disposed within and spaced apart from the outer cylindrical storage electrode, and a conductive liner residue is interposed between a bottom of the outer cylindrical storage electrode and a bottom of the inner storage electrode. The conductive liner residue electrically connects the outer cylindrical storage electrode to the inner storage electrode. Depending on the storage electrode dimension, the inner storage electrode can exhibit a circular columnar configuration or a cylindrical configuration.

BRIEF DESCRIPTION OF THE DRAWINGS

The above features and advantages of the invention will become apparent upon reference to the following detailed description of specific embodiments and the attached drawings, of which.

DESCRIPTION OF PREFERRED EMBODIMENTS

Korean Patent Application No. 99-48927, filed on Nov. 5, 1999, and entitled: "Method of Manufacturing Capacitor in a Semiconductor Integrated Circuit and Capacitor Fabricated Thereby," is incorporated herein by reference in its entirety.

The present invention now will be described more fully hereinafter with reference to the accompanying drawings, in which preferred embodiments of the invention are shown. In the drawings, like reference numerals denote like embodiments. In the drawings, the thickness of layers and regions are exaggerated for clarity. It also will be understood that when a layer is referred to as being "on" another layer or substrate, it can be directly on the other layer or substrate or intervening layers also may be present. Moreover, each embodiment described and illustrated herein includes its complementary conductivity type embodiment as well. Moreover, reference to (and depiction in the drawings of) the presence of a given number of features on the semiconductor substrate is made for reasons of clarity of description. Skilled artisans will appreciate that other features may exist, and that more or less than the number of features so referenced may exist.

An embodiment of the invention relates to a method of manufacturing a capacitor in a semiconductor integrated circuit that includes first providing a semiconductor substrate having disposed thereon an interlayer insulating layer an upper etching stopper layer and a lower sacrificial insulating layer then are sequentially formed on the interlayer insulating layer on the semiconductor substrate the lower sacrificial insulating layer and the upper etching stopper layer then are sequentially patterned to form a storage electrode hole, and to expose a predetermined portion of the interlayer insulating layer. The method then includes forming an outer cylindrical storage electrode in the storage electrode hole, a conductive liner surrounded by the outer cylindrical storage electrode, and an inner storage electrode surrounded by the conductive liner. Finally, the method of an embodiment of the invention includes selectively etching the conductive liner to expose an inner sidewall of the outer cylindrical storage electrode and an outer sidewall of the inner storage electrode.

It is preferred in the invention that, providing the semiconductor substrate having disposed thereon an interlayer insulating layer comprises, forming the interlayer insulating layer on the semiconductor substrate, and patterning to form a storage electrode contact hole exposing a predetermined portion of the semiconductor substrate. A storage contact plug then is formed in the storage electrode contact hole. It is preferred that the storage electrode hole exposes the storage contact plug and a portion of the interlayer insulating layer outside the storage contact plug. The interlayer insulating layer of this embodiment preferably is comprised of a stacked layer comprising a first interlayer insulating layer, a lower etching stopper layer, and a second interlayer insulating layer.

It also is preferred that forming the storage electrode hole is followed by isotropically etching the lower sacrificial insulating layer and the interlayer insulating layer to enlarge the storage electrode hole while at the same time allowing the upper etching stopper layer to protrude horizontally from a sidewall of the enlarged storage electrode hole. The isotropic etching preferably stops at the lower etching stopper layer and the contact plug protrudes vertically from a top surface of the lower etching stopper layer.

Forming the outer cylindrical storage electrode in the storage electrode hole, the conducive liner on the outer cylindrical storage electrode, and the inner storage electrode on the conductive liner preferably is accomplished by sequentially forming a conformal first and second conductive layer on the resultant having the storage electrode hole. A third conductive layer filling the storage electrode hole then is formed on the resultant having the conformal second conductive layer. The method also includes planarizing the third, second and first conductive layers until the lower sacrificial insulating layer is exposed. It is preferred that the inner storage electrode has a circular columnar configuration. The first, second, and third conductive layers preferably are comprised of a polysilicon layer, a titanium nitride layer, and a polysilicon layer, respectively.

In an alternative embodiment, forming the outer cylindrical storage electrode in the storage electrode hole, the conducive liner on the outer cylindrical storage electrode, and the inner storage electrode on the conductive liner entails forming a conformal first, second, and third conductive layer on the resultant having the storage electrode hole. An upper sacrificial insulating layer filling the storage electrode hole then is formed on the resultant having the third conductive layer. The upper sacrificial insulating layer, third, second and first conductive layers are planarized until the lower sacrificial insulating layer is exposed. It is preferred that the inner storage electrode has a cylindrical configuration. It also is preferred that the method further comprises removing the remainder of the upper sacrificial insulating layer existing in the inner storage electrode.

The method of an embodiment of the invention also preferably includes removing the lower sacrificial insulating layer to expose an outer sidewall of the outer cylindrical storage electrode, and sequentially forming a dielectric layer and a plate electrode on the exposed outer and inner sidewalls of the outer cylindrical storage electrode and exposed outer sidewall of the inner storage electrode. It also is preferred in the invention that the upper etching stopper layer is comprised of a silicon nitride layer and the lower sacrificial insulating layer is comprised of a silicon oxide layer.

In accordance with an additional feature of an embodiment of the invention, there is provided a capacitor of a semiconductor integrated circuit that includes a semiconductor substrate, and an outer cylindrical storage electrode formed on the semiconductor substrate. In the capacitor of the invention, an inner storage electrode is disposed within and spaced apart from the outer cylindrical storage electrode, and a conductive liner residue is interposed between a bottom of the outer cylindrical storage electrode and a bottom of the inner storage electrode. The conductive liner residue electrically connects the outer cylindrical storage electrode to the inner storage electrode.

The capacitor of the invention preferably further comprises a storage contact plug disposed between the bottom of the outer cylindrical storage electrode and the semiconductor substrate. In this embodiment, an interlayer insulating layer that is formed on the semiconductor substrate preferably surrounds the storage contact plug. The capacitor of the invention also preferably further comprises an upper etching stopper layer formed on the interlayer insulating layer and inserted into a sidewall of the outer cylindrical storage electrode.

The outer cylindrical storage electrode and the inner storage electrode preferably are comprised of a polysilicon layer. It also is preferred that the conductive liner residue be comprised of a conductive material that has an etching selectivity with respect to the outer cylindrical storage electrode and the inner storage electrode. More specifically, it is preferred that the conductive liner residue is comprised of a titanium nitride layer.

The inner storage electrode of the invention preferably has either a circular columnar configuration, or a cylindrical configuration. The capacitor also preferably can comprise a dielectric layer formed on a surface of the outer cylindrical storage electrode, inner storage electrode and conductive liner residue, and a plate electrode formed on the dielectric layer.

Figure 1:
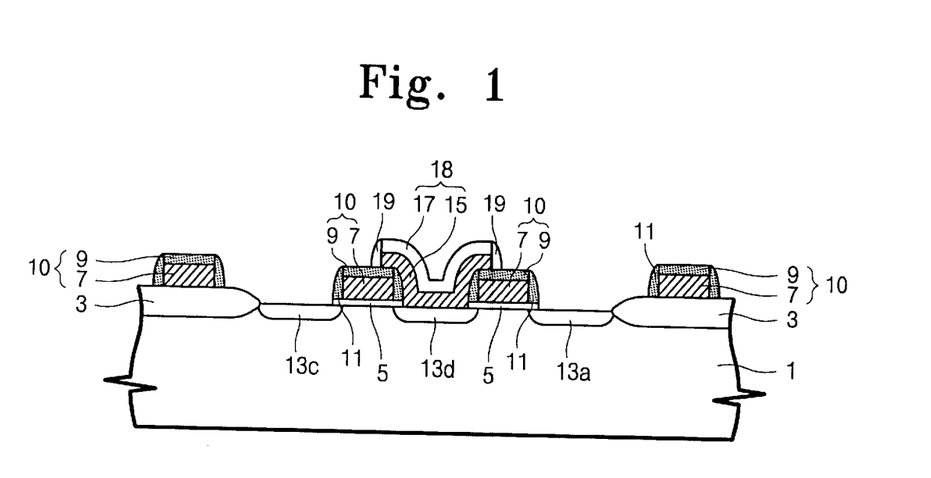
FIGS. 1 to 6 are cross-sectional views of a semiconductor substrate, at selected stages of a method for fabricating a capacitor in accordance with an embodiment of the present invention.

FIGS. 1 to 6 are cross-sectional views of a semiconductor substrate, at selected stages of a method of manufacturing a cell capacitor in accordance with a first embodiment of the present invention. Referring now to FIG. 1, a device isolation layer 3 is formed on a predetermined portion of a semiconductor substrate 1 to define an active region. A gate insulating layer 5, such as a thermal oxide layer, preferably is formed on the active region. A gate conductive layer and a gate capping layer then may be sequentially formed on the gate insulating layers and on the device isolation layer 3. The conductive layer and the capping layer then can be etched to form a plurality of word line patterns 10 intersecting the active region and the device isolation region 3. Each word line pattern 10 preferably is comprised of a stacked layer of a word line 7 and a capping layer pattern 9. A pair of word line patterns 10 typically traverses one active region. Word line spacers 11 preferably are formed on sidewalls of each word line pattern 10, and it is preferred that word line spacer 11 is made of a silicon nitride layer.

Impurity ions of a type opposite that of the semiconductor substrate are implanted into the active region by using the word line patterns 10 as a mask, thereby forming impurity diffusion regions. As shown in FIG. 1, three impurity diffusion regions are formed at one active region since a pair of word line patterns 10 is formed at one active region. Those skilled in the art will recognize that more or less impurity diffusion regions may be present. More specifically, an impurity diffusion region formed at the active region between a pair of the word line patterns 10 can be referred to as a common drain region 13d. Impurity regions formed at the active region outside of the common drain 13d are first and second source regions 13a and 13b. The first source region 13a, the common drain region 13d and word line 7 there between constitute a first access transistor. Likewise, the second source region 13b, the common drain region 13d and word line 7 there between constitute a second access transistor. Accordingly, two access transistors are formed on one active region. Again, skilled artisans recognize that more or less than two access transistors may be formed on the active region.

A bit line pattern 18 then can be formed on the common drain region to be electrically in contact therewith. The bit line pattern 18 preferably is comprised of a bit line 15 that is electrically in contact with the common drain region 13d and a bit line capping pattern 17 that is formed on the bit line 15. A bit line spacer 19 is formed on sidewalls of the bit line pattern 18. The bit line spacer 19 preferably is comprised of the same material as the bit line capping pattern 17, such as silicon nitride.

Figure 2:
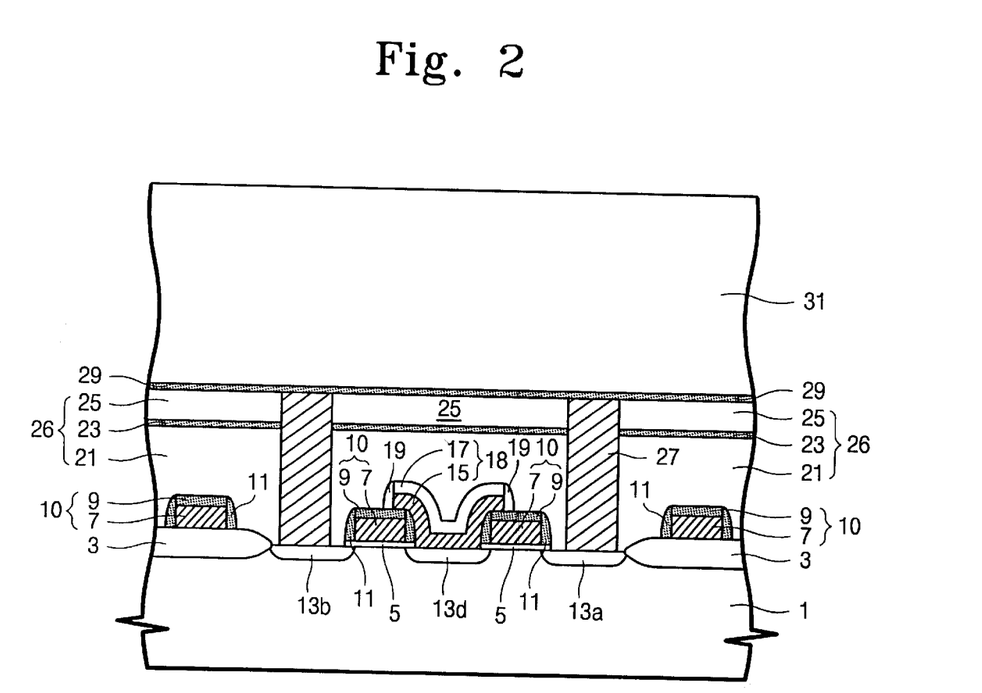

Referring now to FIG. 2, a planarized interlayer insulating layer 26 is formed on the resulting structure. The interlayer insulating layer 26 may be comprised of a single-layered insulating layer. Alternatively, the interlayer insulating layer 26 may be comprised of a multi-layered insulating layer. The single-layered insulating layer preferably is comprised of a chemical vapor deposition (CVD) silicon oxide. The multi-layered insulating layer preferably is comprised of a first interlayer insulating layer 21, a lower etching stopper layer 23 and a second insulating layer 25. At this time, the first and second interlayer insulating layer 21 and 25 preferably are comprised of CVD silicon oxide. The lower etching stopper layer 23 preferably is comprised of a material that has an etching selectivity with respect to the first and second interlayer insulating layers 21 and 25. Preferably, the lower etching stopper layer 23 is made of silicon nitride.

The interlayer insulating layer 26 may be patterned to form storage electrode contact holes to expose the first and second source regions 13a and 13b. Contact plugs 27 preferably are formed in the storage electrode contact holes by a conventional method. An upper etching stopper layer 29 then can be formed on the interlayer insulating layer 26 and on the contact plugs 27. The upper etching stopper layer 29 preferably is made of the same material as the lower etching stopper layer 23, such as silicon nitride. A lower sacrificial insulating layer 31 then can be formed on the upper etching stopper layer 29. The lower sacrificial insulating layer 31 preferably is made of CVD oxide (e.g., a silicon oxide layer).

Figure 3:
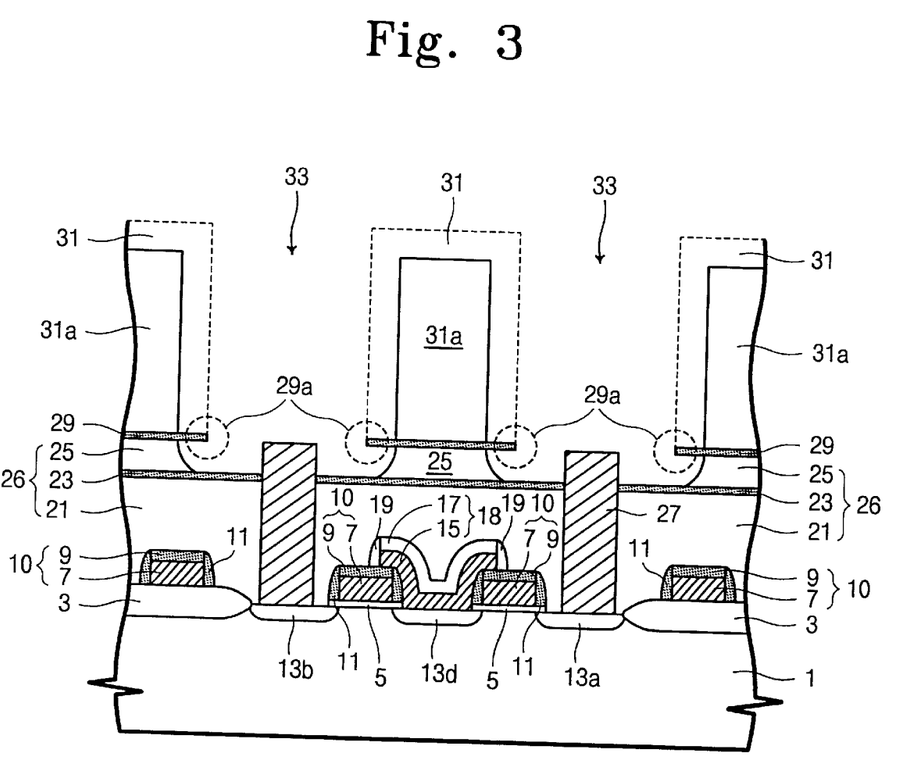

Referring now to FIG. 3, the lower sacrificial insulating layer 31 and the upper etching stopper layer 29 preferably are patterned to form storage electrode holes 33 that expose the contact plug 27. Preferably, the storage electrode holes 33 also expose a portion of the interlayer insulating layer 26 disposed outside of the contact plug 27. The now patterned lower sacrificial insulating layer 31 preferably can be continuously isotropically etched to increase the aperture (dimension) of the storage electrode holes. The isotropic etching selectively etches oxide (i.e., the lower sacrificial insulating layer 31 and the second inter layer insulating layer 25) with respect to nitride (i.e., the upper and lower etching stopper layers 29 and 23). Those skilled in the art are capable of isotropically and selectively etching these respective layers with respect to the upper and lower etching stopper layers 29 and 23, using the guidelines provided herein.

At this time, the now patterned lower sacrificial insulating layer 31 is shrunk (see reference number 31a) and a portion of the interlayer insulating layer 26, i.e., the second interlayer insulating layer 25, also is isotropically etched so that the upper etching stopper layer 29 protrudes from the sidewalls of the storage electrode holes 33 and into the storage electrode holes 33 (see reference number 29a). In addition, the contact plug 27 protrudes vertically from a top surface of the lower etching stopper layer 23.

Figure 4:
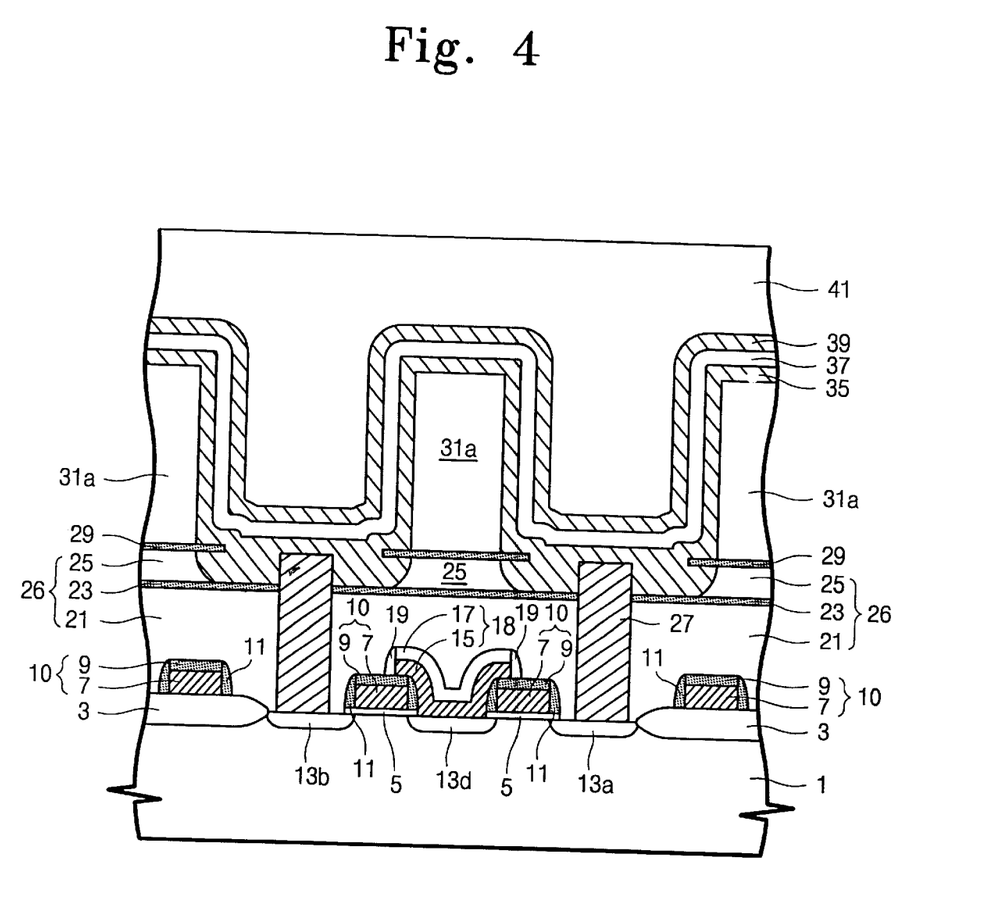

Referring now to FIG. 4, a conformal first, second, and third conductive layer 35, 37 and 39 are formed on the resultant having the storage electrode holes 33. As shown in FIG. 4, these layers follow the topology of the storage electrode holes 33. The first conductive layer 35 is so formed that the protruding upper etching stopper layer 29a and the protruding contact plug are partially covered by, and inserted into the first conductive layer 35. The first and third conductive layers 35 and 39 preferably are comprised of polysilicon. The second conductive layer 37 preferably is made of a material that has an etching selectivity with respect to the first and third conductive layers 35 and 39. Preferably, the second conductive layer is comprised of titanium nitride. An upper sacrificial insulating layer 41 is formed on the third conductive layer 39 to fill the concave region caused by the storage electrode hole 33. For example, the upper sacrificial insulating layer 41 preferably is comprised of a planarized CVD oxide, a photoresist, or an SOG (spin on glass).

Figure 5:
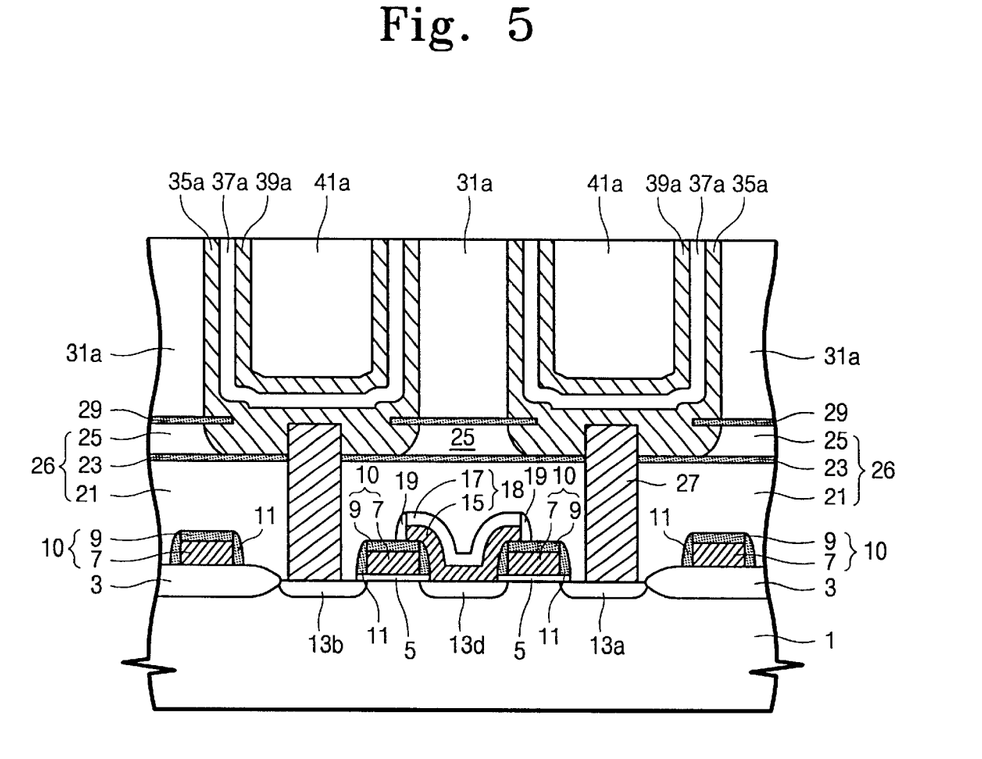

Referring now to FIG. 5, the upper sacrificial insulating layer 41, the third conductive layer 39, the second conductive layer 37 and the first conductive layer 35 are blanket etched until a top surface of the lower sacrificial insulating layer 31a is exposed, thereby forming an outer cylindrical storage electrode 35a in the storage electrode hole, a conductive liner 37a surrounded by the outer cylindrical storage electrode 35a, and an inner cylindrical storage electrode 39a surrounded by the conductive liner 37a. At this time, a portion of the upper sacrificial insulating layer 41a remains inside the inner cylindrical storage electrode 39a.

Figure 6:
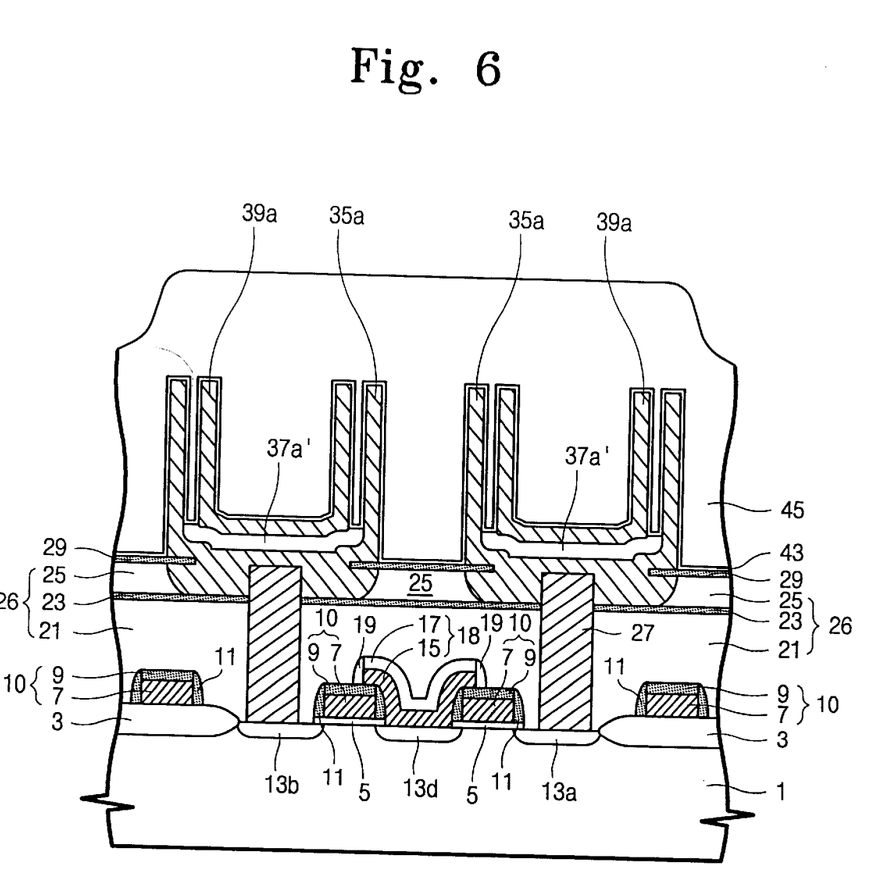

Referring now to FIG. 6, the upper sacrificial insulating layer 41a inside the inner cylindrical storage electrode 39a and the lower sacrificial insulating layer 31a are removed to expose an inner surface of the inner cylindrical electrode 39a and an outer surface of the outer cylindrical storage electrode 35a. At this time, in the case that the upper sacrificial insulating layer 41 is comprised of the same material as lower sacrificial insulating layer 31, such as a CVD oxide layer, the upper and lower sacrificial insulating layers can be removed by applying an oxide etchant solution such as BOE (buffered oxide etchant) or hydrofluoric acid. Skilled artisans are capable of removing both upper and lower sacrificial insulating layers, using the guidelines provided herein.

The conductive liner 37a, (e.g., preferably made of titanium nitride) can be selectively etched by using a mixed solution containing, inter alia, $NH_4OH$, $H_2O_2$ and deionised (DI) water, thereby forming a conductive liner residue 37a' between the bottom of the outer cylindrical storage electrode 35a and the bottom of the inner cylindrical storage electrodes 39a. Accordingly, an inner wall of the outer cylindrical storage electrode 35a, and an outer wall of the inner cylindrical storage electrode 39a are exposed.

A dielectric layer 43 and a plate electrode 45 then preferably are sequentially formed on the exposed inner and outer walls of the outer and inner cylindrical storage electrodes 35a and 39a, respectively. The dielectric layer 43 preferably is comprised of an insulating layer such as an oxide layer, N/O (nitride/oxide), O/N/O (oxide/nitride/oxide), or the like. The plate electrode 45 preferably is comprised of a polysilicon layer, or other similar layer.

Figure 7:
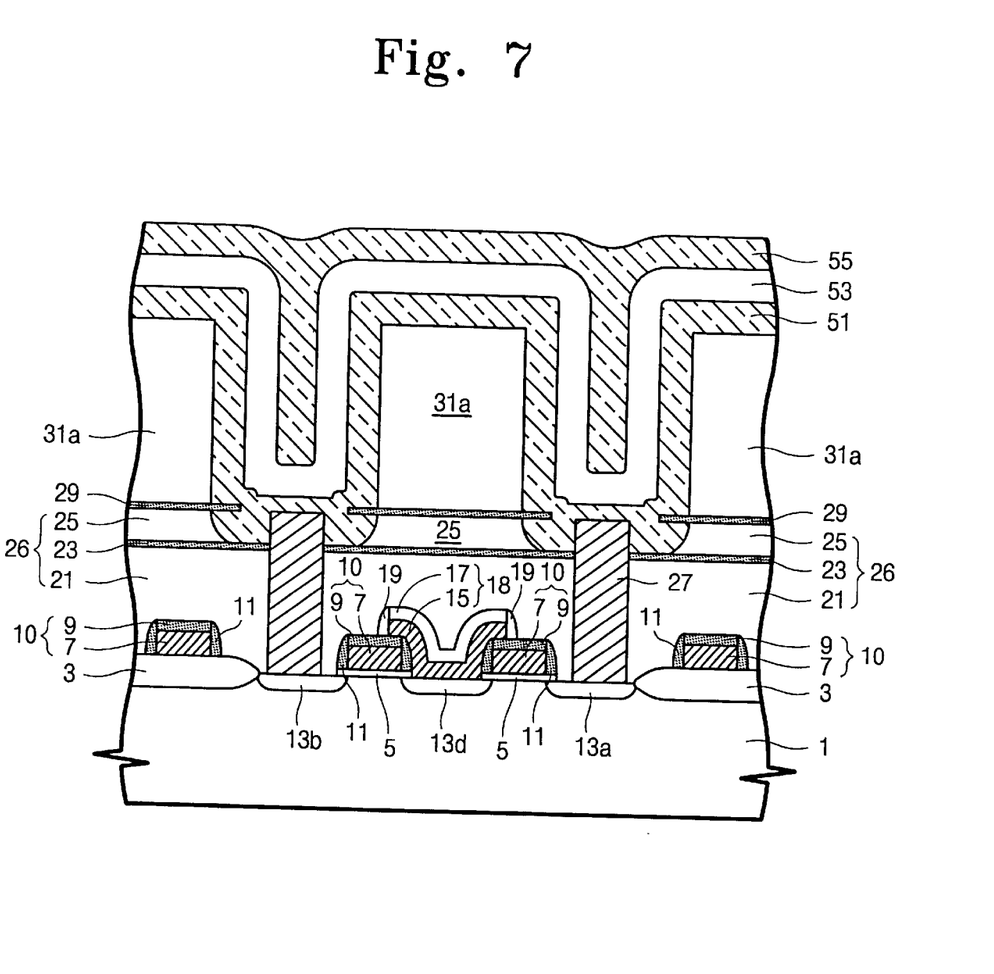
FIGS. 7 to 9 are cross-sectional views of a semiconductor substrate, at selected stages of a method for fabricating a capacitor in accordance with another embodiment of the present invention.
Figure 8:
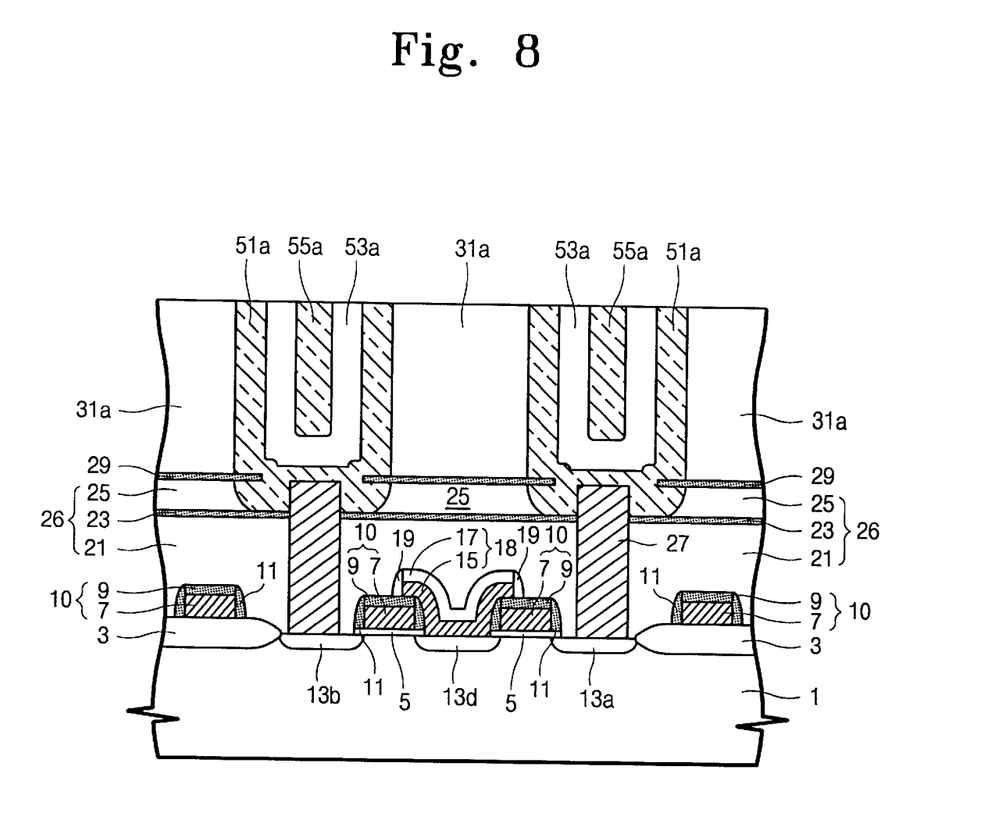
Figure 9:
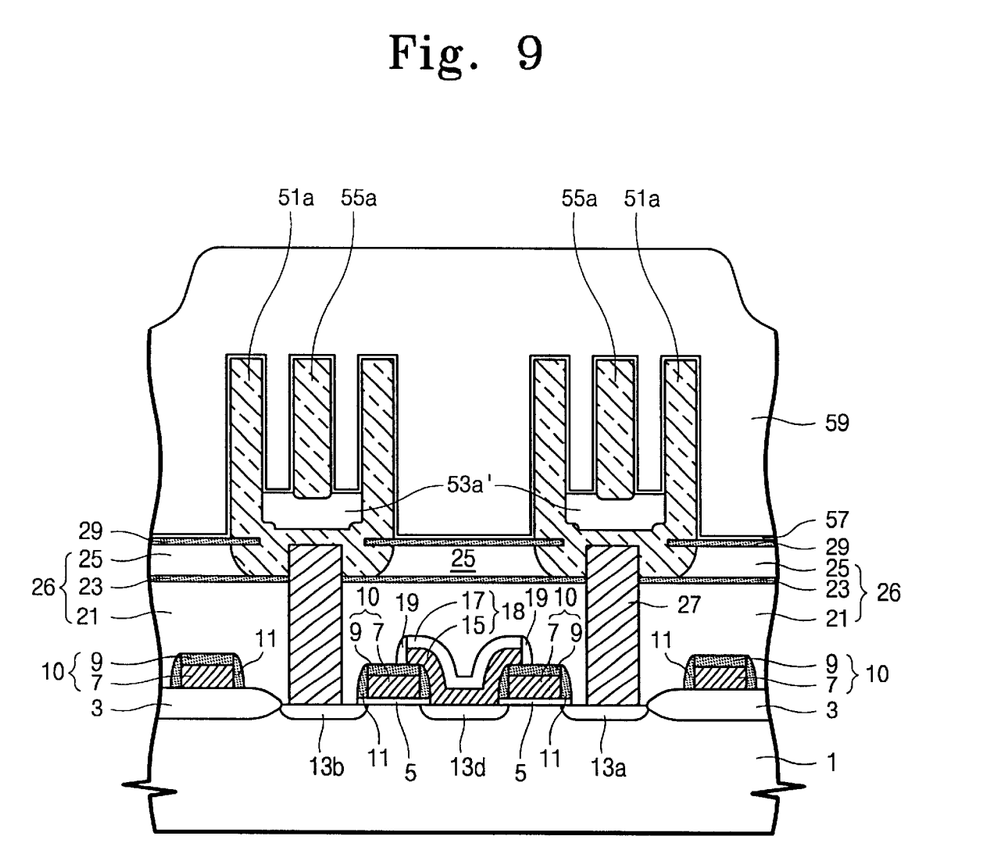

FIGS. 7 to 9 are cross-sectional views, at selected stages illustrating a method of fabricating a capacitor in accordance with another embodiment of the present invention. This embodiment shows a method of forming a storage electrode having a relatively narrower width, when compared to that of the first embodiment described above with reference to FIGS. 4–6. In FIGS. 7 to 9, like components functioning as shown in FIGS. 1 to 6 are identified with the same reference numbers and their explanation is only briefly described or omitted.

Referring now to FIG. 7, as in FIGS. 1 to 3, access transistors, bit line pattern 18, bit line spacer 19, an interlayer insulating layer 26, storage contact plugs 27, an upper etching stopper layer 29, a shrunk and patterned lower sacrificial insulating layer 31a, and storage electrode holes 33, are formed over a semiconductor substrate. First to third conductive layers 51, 53, and 55 are sequentially formed on the resultant structure having the storage electrode holes 33 (see, FIG. 3 for illustration of storage electrode holes 33). At this time, if the width of the storage electrode holes 33 is relatively narrow, the concave region surrounded by the second conductive layer 53 is completely filled with the third conductive layer 55, as shown in FIG. 7. In addition, the protruding portion of the upper etching stopper layer 29 corresponding to protruding portion 29a shown in the previous embodiment (and FIG. 3) also can be formed. In that case, the protruding portion of the upper etching stopper layer 29 is inserted into the first conductive layer 51. The first to third conductive layers 51, 53 and 55 preferably are formed of the same material as the first to third conductive layers 35, 37 and 39 of the previous embodiment.

Referring now to FIG. 8, the third to first conductive layers 55, 53 and 51 are sequentially blanket etched until a top surface of the patterned and shrunk lower sacrificial insulating layer 31a is exposed, thereby forming an outer cylindrical storage electrode 51a formed within the storage electrode hole 33. A conductive liner 53a also is formed, and is surrounded by the outer cylindrical storage electrode 53a. Finally, an inner circular columnar storage electrode 55a is formed and is surrounded by the conductive liner 53a.

Referring now to FIG. 9, the shrunk lower sacrificial insulating layer 31a is removed to expose an outer wall of the outer cylindrical storage electrode 51a. Also, the conductive liner 53a can be selectively removed with respect to the outer and inner storage electrodes 51a and 55a, to expose an inner wall of the outer cylindrical storage electrode 51a and an outer wall of the inner circular columnar storage electrode 55a. At this time, a conductive liner residue 53a' remains between the bottom of the outer cylindrical storage electrode 51a and the bottom of the inner circular columnar storage electrode 55a. A dielectric layer 57 and a plate electrode 59 then can be sequentially formed on the resultant structure having the conductive liner residue 53a'.

Figure 10:
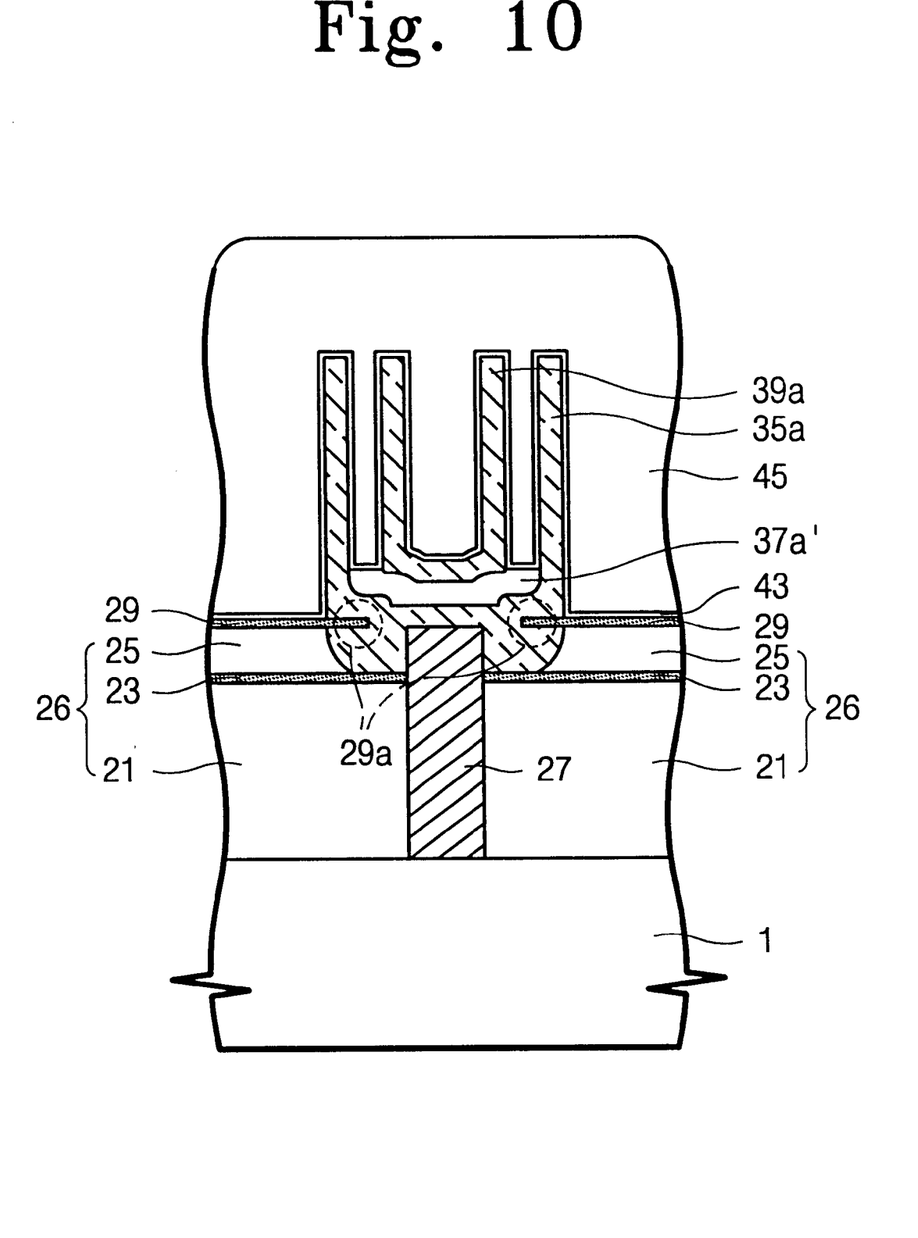
FIG. 10 schematically shows a capacitor in accordance with an embodiment of the present invention.
Figure 11:
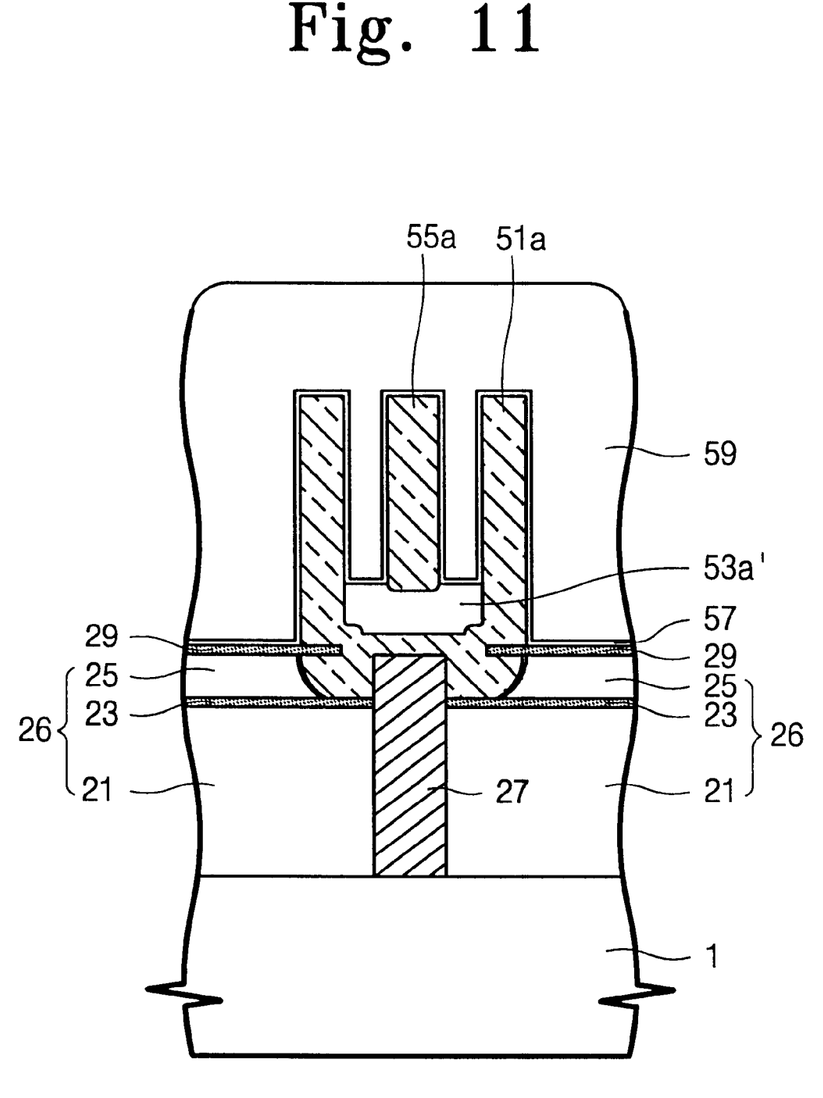
FIG. 11 schematically shows a capacitor in accordance with another embodiment of the present invention.

FIG. 10 is a cross-sectional view of a capacitor according to an embodiment of the present invention shown in FIGS. 1 to 6. FIG. 11 is a cross-sectional view of a capacitor according to another embodiment of the present invention shown in FIGS. 7 to 9. Herein, in FIGS. 10 and 11, like components functioning as shown in FIGS. 1 to 9 are identified with like reference numbers.

Referring now to FIG. 10, an outer cylindrical storage electrode 35a is located over a semiconductor substrate 1, and an inner cylindrical storage electrode 39a is disposed interior to the outer cylindrical storage electrode 35a, and is spaced apart there from by a predetermined distance. A conductive liner residue 37a' is interposed between the bottom of the outer cylindrical storage electrode 35a and the bottom of the inner cylindrical storage electrode 39a, thereby electrically connecting the two electrodes 35a and 39a.

A storage contact plug 27 further is disposed between and connecting the bottom of the outer cylindrical storage electrode 35a and the semiconductor substrate 1. At this time, an interlayer insulating layer 26 that is formed on the semiconductor substrate 1 surrounds a sidewall of the storage contact plug 27. The interlayer insulating layer 26 can be a single layer comprised of an insulator such as CVD oxide, or a multi-layered interlayer insulating layer comprised of a first interlayer insulating layer 21, a lower etching stopper layer 23 and a second interlayer insulating layer 25 in this order on the semiconductor substrate 1. At this time, it is preferable that the first and second interlayer insulating layers 21 and 25 be comprised of a CVD oxide. The lower etching stopper layer 23 preferably is comprised of a material layer that has an etching selectivity with respect to the first and second interlayer insulating layers 21 and 25. Preferably, the lower etching stopper layer 23 is comprised of a silicon nitride.

An upper etching stopper layer 29 is disposed on the interlayer insulating layer 26. The upper etching stopper layer 29 preferably is comprised of the same material as the lower etching stopper layer 23, ie., silicon nitride. It is preferable that the edge portion of the upper etching stopper layer 29, i.e., a protruding part 29a, is inserted into a predetermined region of an outer wall of the outer cylindrical storage electrode 35a. As a result, the outer cylindrical storage electrode 35a is not easily lifted away from the semiconductor substrate 1 even in the case of an external physical force. Accordingly, the capacitor of the invention can prevent the outer cylindrical storage electrode from breaking down during a subsequent cleaning process, such as a spin dry process. Accordingly, a stable capacitor storage electrode can be obtained in the present invention.

A capacitor dielectric layer 43 and a plate electrode 45 are disposed on surfaces of the outer cylindrical storage electrode 35a, the conductive liner residue 37a' and the inner cylindrical storage electrode 39a.

Referring now to FIG. 11, an outer cylindrical storage electrode 51a is located over a semiconductor substrate 1, and an inner circular columnar storage electrode 55a is disposed interior to the outer cylindrical storage electrode 35a, and is spaced apart there from by a predetermined distance. A conductive liner residue 53a' is interposed between the bottom of the outer cylindrical storage electrode 51a and the bottom of the inner circular columnar storage electrode 55a, thereby electrically connecting the two electrodes 51a and 55a.

As described above with reference to FIG. 10, a storage contact plug 27 and an interlayer insulating layer 26 (preferably comprised of a first interlayer insulating layer 21, lower etching stopper layer 23, and second interlayer insulating layer 25) further can be disposed between the bottom of the outer cylindrical storage electrode 35a and the semiconductor substrate 1. A lower etching stopper layer 23 preferably is comprised of a layer that has an etching selectivity with respect to the first and second interlayer insulating layers 21 and 25. Preferably, the lower etching stopper layer 23 is made of a silicon nitride. An upper etching stopper layer 29 is disposed on the interlayer insulating layer 26. The upper etching stopper layer 29 has a protruding portion 29a that is inserted into a predetermined region of an outer wall of the outer cylindrical storage electrode 51a.

A capacitor dielectric layer 57 and a plate electrode 59 are disposed on surfaces of the outer cylindrical storage electrode 51a, the conductive liner residue 53a' and the inner circular columnar storage electrode 55a.

As described above, according to the various embodiments of the present invention, the outer storage electrode, the conductive liner and the inner storage electrode are formed of a stacked layer of first to third conductive layers in the storage electrode holes. Accordingly, unlike in the prior art, there is no need to isotropically etch an insulator to form an insulating spacer on the inner wall of an outer storage electrode in accordance with the present invention. As a result, the bottom portion of the outer storage electrode is not subjected to etching damage, thereby improving contact resistance between the outer and inner storage electrodes.

In addition, according to the present invention, the conductive liner disposed between the outer and inner storage electrodes is selectively etched to expose the outer wall of the inner storage electrode and the inner wall of the outer storage electrode. Accordingly, the space between the outer and inner storage electrodes can be uniformly controlled.

Also according to the present invention, the upper etching stopper layer can protrude and be inserted into a predetermined portion of an outer wall of the outer cylindrical storage electrode. As a result, the outer cylindrical storage electrode is not readily lifted away from the substrate, or is not broken down by external physical forces prior to the formation of the dielectric layer and the plate electrode.

It will be apparent to those skilled in the art that the innovative concepts disclosed in the present application can be applied in a wide variety of contexts. Moreover, the preferred embodiments described above may be modified in a variety of ways. Accordingly, it should be understood that various modifications might be made to the invention without departing from the spirit and scope thereof.

What is claimed is:

1. A method of manufacturing a capacitor in a semiconductor integrated circuit, comprising:

providing a semiconductor substrate having an interlayer insulating layer disposed thereon;

sequentially forming an upper etching stopper layer and a lower sacrificial insulting layer on the interlayer insulating layer on the semiconductor substrate;

sequentially patterning the lower sacrificial insulating layer and the upper etching stopper layer to form a storage electrode hole and to expose a predetermined portion of the interlayer insulating layer;

forming an outer cylindrical storage electrode in the storage electrode hole, a conductive liner surrounded by the outer cylindrical storage electrode, and an inner storage electrode surrounded by the conductive liner; and selectively etching the conductive liner to expose an inner sidewall of the outer cylindrical storage electrode and an outer sidewall of the inner storage electrode.

2. The method according to claim 1, wherein providing a semiconductor substrate having an insulating layer deposited thereon comprises the steps of;

forming the interlayer insulating layer on the semiconductor substrate;

patterning the interlayer insulating layer to form a storage electrode contact hole exposing a predetermined portion of the semiconductor substrate; and forming a storage contact plug in the storage electrode contact hole, wherein the storage electrode hole exposes the storage contact plug and a portion of the interlayer insulating layer outside the storage contact plug.

3. The method according to claim 2, wherein the interlayer insulating layer is comprised of a stacked layer comprising a first interlayer insulating layer, a lower etching stopper layer, and a second interlayer insulating layer.

4. The method according to claim 2, wherein forming the storage electrode hole is followed by isotropically etching the lower sacrificial insulating layer and the interlayer insulating layer to enlarge the storage electrode hole while at the same time permitting the upper etching stopper layer to protrude horizontally from a sidewall of the enlarged storage electrode hole.

5. The method according to claim 3, wherein forming the storage electrode hole is followed by isotropically etching the lower sacrificial insulating layer and the interlayer insulating layer to enlarge the storage electrode hole and to make the upper etching stopper layer protrude horizontally from a sidewall of the enlarged storage electrode hole, wherein the isotropic etching stops at the lower etching stopper layer and the contact plug protrudes vertically from a top surface of the lower etching stopper layer.

6. The method according to claim 1, wherein forming the outer cylindrical storage electrode in the storage electrode hole, the conducive liner on the outer cylindrical storage electrode, and the inner storage electrode on the conductive liner, comprises:

sequentially forming a conformal first and second conductive layer on the resultant having the storage electrode hole;

forming a third conductive layer filling the storage electrode hole on the resultant having the conformal second conductive layer; and planarizing the third, second and first conductive layers until the lower sacrificial insulating layer is exposed, wherein the inner storage electrode has a circular columnar configuration.

7. The method according to claim 6, wherein the first, second and third conductive layers are formed of a polysilicon layer, a titanium nitride layer, and a polysilicon layer, respectively.

8. The method according to claim 1, wherein forming the outer cylindrical storage electrode in the storage electrode hole, the conducive liner on the outer cylindrical storage electrode, and the inner storage electrode on the conductive liner, comprises:

forming a conformal first, second, and third conductive layer on the resultant having the storage electrode hole;

forming an upper sacrificial insulating layer filling the storage electrode hole on the resultant having the third conformal conductive layer; and planarizing the upper sacrificial insulating layer, third, second and first conductive layers until the lower sacrificial insulating layer is exposed, wherein the inner storage electrode has a cylindrical configuration.

9. The method according to claim 8, further comprising removing the remainder of the upper sacrificial insulating layer existing in the inner storage electrode.

10. The method according to claim 1, further comprising:

removing the lower sacrificial insulating layer to expose an outer sidewall of the outer cylindrical storage electrode; and sequentially forming a dielectric layer and a plate electrode on the exposed outer and inner sidewalls of the outer cylindrical storage electrode and exposed outer sidewall of the inner storage electrode.

11. The method according to claim 1, wherein the upper etching stopper layer is comprised of a silicon nitride layer and the lower sacrificial insulating layer is comprised of a silicon oxide layer.

* * * * *